United States Patent
Murota

(10) Patent No.: US 10,501,627 B2
(45) Date of Patent: Dec. 10, 2019

(54) COMPOSITION FOR OPTICAL IMPRINT AND METHOD FOR PRODUCING PATTERN USING THE SAME

(71) Applicant: Tokyo Ohka Kogyo Co., Ltd., Kawasaki-shi (JP)

(72) Inventor: Atsushi Murota, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 696 days.

(21) Appl. No.: 14/598,596

(22) Filed: Jan. 16, 2015

(65) Prior Publication Data

US 2015/0203683 A1 Jul. 23, 2015

(30) Foreign Application Priority Data

Jan. 17, 2014 (JP) ................. 2014-007250

(51) Int. Cl.

| C08L 83/04 | (2006.01) |
| G03F 7/075 | (2006.01) |
| G03F 7/038 | (2006.01) |
| G06F 7/40 | (2006.01) |
| G03F 7/00 | (2006.01) |
| C08K 5/07 | (2006.01) |
| C08K 5/08 | (2006.01) |
| C08G 77/20 | (2006.01) |
| C08G 77/00 | (2006.01) |

(52) U.S. Cl.
CPC ............ *C08L 83/04* (2013.01); *C08K 5/07* (2013.01); *C08K 5/08* (2013.01); *G03F 7/0002* (2013.01); *G03F 7/0388* (2013.01); *G03F 7/0757* (2013.01); *G06F 7/40* (2013.01); *C08G 77/20* (2013.01); *C08G 77/80* (2013.01)

(58) Field of Classification Search
CPC .................. C03F 7/0002; C08L 83/04
See application file for complete search history.

(56) References Cited

U.S. PATENT DOCUMENTS

| 5,772,905 A | 6/1998 | Chou |
| 2010/0206470 A1* | 8/2010 | Chen .............. B82Y 10/00 156/245 |

FOREIGN PATENT DOCUMENTS

| JP | 2003-100609 | 4/2003 |
| JP | 2010-013513 A | 1/2010 |
| JP | 2011-023698 | 2/2011 |

OTHER PUBLICATIONS

Notice of Reasons for Rejection issued in Japanese Patent Application No. 2014-007250, dated Jun. 27, 2017.

* cited by examiner

*Primary Examiner* — Sanza L. McClendon
(74) *Attorney, Agent, or Firm* — Knobbe, Martens, Olson & Bear LLP

(57) ABSTRACT

A composition for optical imprint having excellent transferability of a mold shape and giving a pattern having excellent alkali resistance at high temperature by optical imprint and subsequent heating and a method for producing a pattern using the composition. The composition includes a polysiloxane including a structural unit 1 represented by Formula (a1) and a structural unit 2 represented by Formula (a2) and a polymerization initiator. The polysiloxane has a structural unit 1 content of 30% to 85% by mole and a structural unit 2 content of 15% to 70% by mole based on the entire structural units in the polysiloxane. In the formulae, $R^1$ represents a group containing an ethylenic double bond, and $R^2$ represents an aryl group having 6 to 15 carbon atoms which may have a substituent.

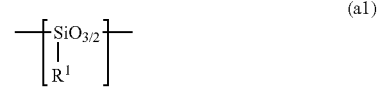

(a1)

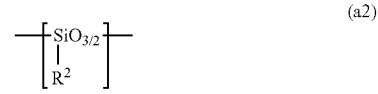

(a2)

15 Claims, 1 Drawing Sheet

COMPOSITION FOR OPTICAL IMPRINT AND METHOD FOR PRODUCING PATTERN USING THE SAME

This application claims priority to Japanese Patent Application No. 2014-007250, filed Jan. 17, 2014, the entire content of which is incorporated herein by reference.

BACKGROUND OF THE INVENTION

Field of the Invention

The present invention relates to a composition for optical imprint and a method for producing a pattern using the composition.

Related Art

Lithography technology is core technology for processing semiconductor devices, and wiring has been further refined with recent high integration of semiconductor integrated circuits (ICs). Micronization is generally achieved by shortening the wavelength of a light source, for example, by using a KrF excimer laser, an ArF excimer laser, a $F_2$ laser, extreme ultraviolet light (EUV) beams, electron beams (EBs), or X-rays, or by increasing the numerical aperture (NA) of the lens of an exposure device (high NA). The shortening of the wavelength of a light source, however, requires a novel expensive exposure device.

In such a circumstance, Chou, et al. proposed imprint lithography (see Patent Document 1). In the imprint lithography, a mold provided with a predetermined pattern is pressed against a resin layer on a surface of a base to transfer the pattern of the mold to the resin layer.

The imprint lithography first proposed by Chou, et al. uses a thermoplastic resin, polymethyl methacrylate (PMMA), as the resin layer and includes the steps of softening the resin with heat prior to deformation of the resin layer; pressing a mold against the resin layer for deformation; and then cooling the resin layer for solidification and is therefore called "thermal imprint lithography".

However, this thermal imprint lithography has a problem of a low throughput due to the heating and the cooling of the resin layer that take a long time.

The imprint lithography has also been employed for used other than semiconductor use, for example, for use as permanent films that are directly used in products after processing, such as CMOS sensors or antireflection films. In many of such uses, a method called "room temperature imprint" (see Patent Document 2), whose processing process is simple, is employed.

However, the method through the room temperature imprint has a problem of being unable to reduce the pressure for pressing a mold and a problem of a difficulty in forming a pattern of not larger than a certain size.

In addition, imprint lithography using a photocurable resin curing with light (ultraviolet rays or electron rays) has been proposed. In this process, a mold is pressed against a resin layer containing a photocurable resin, the resin is cured by irradiation with light, and the mold is then peeled to give a transferred pattern (structure). This process cures the resin layer with light and is therefore called "optical imprint lithography".

Patent Document 1: US Patent Application Publication No. 5772905, Specification

Patent Document 2: Japanese Unexamined Patent Application, Publication No. 2003-100609

Patent Document 3: Japanese Unexamined Patent Application, Publication No. 2011-23698

SUMMARY OF THE INVENTION

Room temperature imprint is generally used in permanent film use, but it is difficult to form a fine pattern in the next generation by the room temperature imprint. Meanwhile, although the conventional composition for optical imprint can be used for forming fine patterns, the composition is inferior in heat resistance that is required in permanent film use.

In the use as permanent films such as antireflection films, resistances against acid, alkali, and solvent are required. Imprint compositions including general siloxane materials (for example, see Patent Document 3) have a problem of, in particular, low resistance to alkali.

The present invention has been made in light of the above-described problems, and the object thereof is to provide a composition for optical imprint having excellent transferability of a mold shape and giving a pattern having excellent alkali resistance at high temperature by optical imprint and subsequent heating, and to provide a method for producing a pattern using the composition.

The present inventors have found that the above-mentioned problems can be solved by using a specific polysiloxane having a branched structure as a polymer in a composition for optical imprint, and accomplished the present invention. Specifically, the present invention provides the following.

A first aspect of the present invention is a composition for optical imprint comprising a polysiloxane including a structural unit 1 represented by Formula (a1) and a structural unit 2 represented by Formula (a2) and a polymerization initiator, wherein the polysiloxane has a structural unit 1 content of 30% to 85% by mole and a structural unit 2 content of 15% to 70% by mole based on the entire structural units in the polysiloxane,

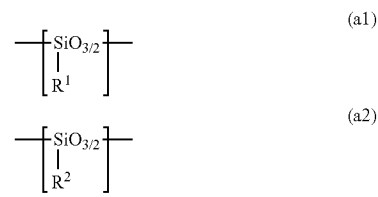

wherein, $R^1$ represents a group containing an ethylenic double bond; and $R^2$ represents an aryl group having 6 to 15 carbon atoms which may have a substituent.

A second aspect of the present invention is a method for producing a pattern comprising a step of forming a composition layer of the composition for optical imprint on a substrate; a step of deforming the composition layer by pressing a mold against the composition layer; a step of exposing the composition layer to light in a state of pressing the mold; a step of peeling the mold from the exposed composition layer; and a step of heating the composition layer after the step of peeling.

The present invention can provide a composition for optical imprint having excellent transferability of a mold shape and giving a pattern having excellent alkali resistance at high temperature by optical imprint and subsequent heating and can provide a method for producing a pattern using the composition.

DETAILED DESCRIPTION OF THE INVENTION

Composition for Optical Imprint

Figure 1A:
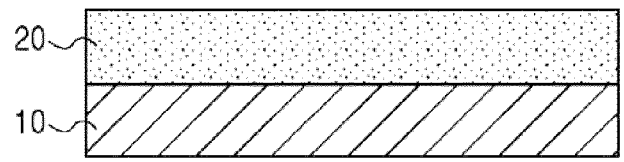
FIGS. 1A to 1D show a process drawing illustrating a method for producing a pattern according to an embodiment of the present invention.

The composition for optical imprint according to the present invention comprises a polysiloxane including a structural unit 1 represented by Formula (a1) and a structural unit 2 represented by Formula (a2) and a polymerization initiator. The content of the structural unit 1 is 30% to 85% by mole and the content of the structural unit 2 is 15% to 70% by mole, based on the entire structural units in the polysiloxane. The composition for optical imprint according to the present invention has excellent transferability of a mold shape, and it is possible to obtain a pattern having excellent alkali resistance at high temperature by optical imprint using the composition and subsequent heating.

[Polysiloxane Including Structural Unit 1 Represented by Formula (a1) and Structural Unit 2 Represented by Formula (a2)]

The composition for optical imprint according to the present invention comprises a polysiloxane including a structural unit 1 represented by Formula (a1) and a structural unit 2 represented by Formula (a2). The polysiloxane may be a single polysiloxane or a combination of two or more polysiloxanes.

In Formula (a1), $R^1$ preferably represents a group containing an ethylenic double bond at a terminal thereof, more preferably an acryloyloxyalkyl or methacryloyloxyalkyl group (herein, examples of the alkyl group include alkyl groups having 1 to 6 carbon atoms, specifically, those exemplified as groups represented by $R^3$ below), and particularly preferably an acryloyloxypropyl group and a methacryloyloxypropyl group.

In Formula (a2), $R^2$ represents an aryl group having 6 to 15 carbon atoms which may have a substituent, and preferably an aryl group having 6 to 10 carbon atoms which may have a substituent. Examples of the aryl group represented by $R^2$ include phenyl, biphenyl, fluorenyl, naphthyl, anthryl, and phenanthryl groups. These aryl groups may have a substituent. $R^2$ preferably represents a phenyl group which may have a substituent or a naphthyl group which may have a substituent, and more preferably a phenyl group which may have a substituent. Examples of the substituent include alkyl groups. Examples of the alkyl group as the substituent include alkyl groups having 1 to 6 carbon atoms, specifically, those exemplified as groups represented by $R^3$ below.

The content of the structural unit 1 is 30% to 85% by mole, and preferably 40% to 80% by mole, based on the entire structural units in the polysiloxane. A content of the structural unit 1 of 30% to 85% by mole can easily secure the photocurability and storage stability of the composition for optical imprint according to the present invention while setting the content of the structural unit 2 in an appropriate range.

The content of the structural unit 2 is 15% to 70% by mole, and preferably 20% to 60% by mole, based on the entire structural units in the polysiloxane. A content of the structural unit 2 of 15% to 70% by mole can easily provide a composition for optical imprint according to the present invention having excellent transferability of a mold shape and giving a pattern having excellent alkali resistance at high temperature by optical imprint using the composition and subsequent heating.

The mass average molecular weight of the polysiloxane is not particularly limited as long as the effects of the present invention are not impaired. The mass average molecular weight is preferably 500 to 10000, more preferably 1000 to 5000, and even more preferably 1000 to 3000. The mass average molecular weight of 500 to 10000 brings an excellent balance between an improvement in the effect of reducing the pressing pressure and an improvement in the properties of the shape of a formed pattern. Throughout the specification, the term "mass average molecular weight" refers to a molecular weight in terms of standard polystyrene measured by gel permeation chromatography (GPC).

The polysiloxane is preferably a polysiloxane represented by Formula (a3).

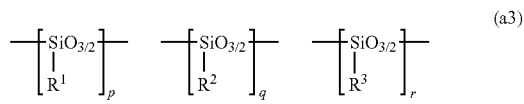

(a3)

wherein, $R^1$ and $R^2$ are the same as above; $R^3$ represents an alkyl group having 1 to 6 carbon atoms; and subscripts p, q, and r represent mole percentages of the structural units referred by the subscripts based on the total moles of structural units in the polysiloxane; the percentage p is 30% to 85% by mole; the percentage q is 15% to 70% by mole; the percentage r is 0% to 40% by mole; provided that the sum of the percentages p, q, and r is 100% by mole, and the percentage r is not higher than the percentage p.

In Formula (a3), $R^3$ represents an alkyl group having 1 to 6 carbon atoms, and preferably 1 to 4. Examples of the alkyl group represented by $R^3$ include methyl, ethyl, propyl, isopropyl, n-butyl, isobutyl, tert-butyl, pentyl, isopentyl, neopentyl, and hexyl groups. Preferred are methyl and ethyl groups, and more preferred is a methyl group.

In Formula (a3), the percentage p is 30% to 85% by mole, and preferably 40% to 80% by mole. A percentage p of 30% to 85% by mole can easily secure the photocurability and storage stability of the composition for optical imprint according to the present invention while setting the percentage q in an appropriate range.

In Formula (a3), the percentage q is 15% to 70% by mole, and preferably 20% to 60% by mole. A percentage q of 15% to 70% by mole can easily provide a composition for optical imprint according to the present invention having excellent transferability of a mold shape and giving a pattern having excellent alkali resistance at high temperature by optical imprint using the composition and subsequent heating.

In Formula (a3), the percentage r is 0% to 40% by mole, preferably 1% to 30% by mole, more preferably 1% to 20% by mole, and even more preferably 1% to 10% by mole, provided that the percentage r is not higher than the percentage p. When a polysiloxane represented by Formula (a3) includes the structural unit referred by subscript r, that is, when subscript r is larger than 0% by mole, the ability of forming a fine pattern at intervals of 100 nm or less can be easily achieved. A percentage r of 40% by mole or less can readily prevent the viscosity of polysiloxane represented by Formula (a3) from excessively increasing. In addition, when the percentage r is not higher than the percentage p, the molar amount of the alkyl group $R^3$ having 1 to 6 carbon atoms is not higher than the molar amount of the group $R^1$ containing an ethylenic double bond, and a sufficient ratio of ethylenic double bond, which is a reactive site, can be readily secured. Consequently, the resulting composition for optical imprint can readily have satisfactory photocurability and makes it possible to perform optical imprint easily.

[Polymerization Initiator]

The polymerization initiator may be any compound that can initiate and accelerate the polymerization of the polysiloxane at the time of light irradiation. Examples of the polymerization initiator include 1-hydroxycyclohexyl phenyl ketone, 2-hydroxy-2-methyl-1-phenylpropan-1-one, 1-[4-(2-hydroxyethoxy)phenyl]-2-hydroxy-2-methyl-1-propan-1-one, 1-(4-isopropylphenyl)-2-hydroxy-2-methyl-propan-1-one, 1-(4-dodecylphenyl)-2-hydroxy-2-methyl-propan-1-one, 2,2-dimethoxy-1,2-diphenylethan-1-one, bis (4-dimethylaminophenyl) ketone, 2-methyl-1-[4-(methylthio)phenyl]-2-morpholinopropan-1-one, 2-benzyl-2-dimethylamino-1-(4-morpholinophenyl)-butan-1-one, ethanone-1-[9-ethyl-6-(2-methylbenzoyl)-9H-carbazol-3-yl]-1-(o-acetyloxime), 2,4,6-trimethylbenzoyl diphenylphosphine oxide, 4-benzoyl-4'-methyldimethylsulfide, 4-dimethylaminobenzoic acid, methyl 4-dimethylaminobenzoate, ethyl 4-dimethylaminobenzoate, butyl 4-dimethylaminobenzoate, 4-dimethylamino-2-methylhexylbenzoic acid, 4-dimethylamino-2-isoamylbenzoic acid, benzyl-β-methoxyethyl acetal, benzyldimethyl ketal, 1-phenyl-1,2-propanedione-2-(o-ethoxycarbonyl) oxime, methyl o-benzoylbenzoate, 2,4-diethylthioxanthone, 2-chlorothioxanthone, 2,4-dimethylthioxanthone, 1-chloro-4-propoxythioxanthone, thioxanthene, 2-chlorothioxanthene, 2,4-diethylthioxanthene, 2-methylthioxanthene, 2-isopropylthioxanthene, 2-ethylanthraquinone, octamethylanthraquinone, 1,2-benzanthraquinone, 2,3-diphenylanthraquinone, azobisisobutyronitrile, benzoyl peroxide, cumene peroxide, 2-mercaptobenzimidazole, 2-mercaptobonzoxazole, 2-mercaptobenzothiazole, 2-(o-chlorophenyl)-4,5-di(m-methoxyphenyl)-imidazolyl dimer, benzophenone, 2-chlorobenzophenone, p,p'-bisdimethylaminobenzophenone, 4,4'-bisdiethylaminobenzophenone, 4,4'-dichlorobenzophenone, 3,3-dimethyl-4-methoxybenzophenone, benzil, benzoin, benzoin methyl ether, benzoin ethyl ether, benzoin isopropyl ether, benzoin n-butyl ether, benzoin isobutyl ether, benzoin butyl ether, acetophenone, 2,2-diethoxyacetophenone, p-dimethylacetophenone, p-dimethylaminopropiophenone, dichloroacetophenone, trichloroacetophenone, p-tert-butylacetophenone, p-dimethylaminoacetophenone, p-tert-butyltrichloroacetophenone, p-tert-butyldichloroacetophenone, α,α-dichloro-4-phenoxyacetophenone, thioxanthone, 2-methylthioxanthone, 2-isopropylthioxanthone, dibenzosuberone, pentyl 4-dimethylaminobenzoate, 9-phenylacridine, 1,7-bis-(9-acridinyl)heptane, 1,5-bis-(9-acridinyl)pentane, 1,3-bis-(9-acridinyl)propane, p-methoxytriazine, 2,4,6-tris(trichloromethyl)-s-triazine, 2-methyl-4,6-bis (trichloromethyl)-s-triazine, 2-[2-(5-methylfuran-2-yl) ethenyl]-4,6-bis(trichloromethyl)-s-triazine, 2-[2-(furan-2-yl)ethenyl]-4,6-bis(trichloromethyl)-s-triazine, 2-[2-(4-diethylamino-2-methylphenyl)ethenyl]-4,6-bis (trichloromethyl)-s-triazine, 2-[2-(3,4-dimethoxyphenyl) ethenyl]-4,6-bis(trichloromethyl)-s-triazine, 2-(4-methoxyphenyl)-4,6-bis(trichloromethyl)-s-triazine, 2-(4-ethoxystyryl)-4,6-bis(trichloromethyl)-s-triazine, 2-(4-n-butoxyphenyl)-4,6-bis(trichloromethyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(3-bromo-4-methoxy) styrylphenyl-s-triazine, and 2,4-bis-trichloromethyl-6-(2-bromo-4-methoxy)styrylphenyl-s-triazine; ketone peroxides such as methyl ethyl ketone peroxide, methyl isobutyl ketone peroxide, and cyclohexanone peroxide; diacyl peroxides such as isobutyl peroxide and bis(3,5,5-trimethylhexanoyl) peroxide; hydroperxoides such as p-menthane hydroperoxide and 1,1,3,3-tetramethylbutyl hydroperoxide; dialkyl peroxides such as 2,5-dimethyl-2,5-bis(t-butylperoxy)hexane; peroxy ketals such as 1,1-bis(t-butylperoxy)-3, 3,5-trimethylcyclohexane; peroxy esters such as t-butyl peroxyneodecanoate and 1,1,3,3-tetramethyl peroxyneodecanoate; peroxydicarbonates such as di-n-propyl peroxydicarbonate and diisopropyl peroxydicarbonate; and azo compounds such as azobisisobutyronitrile, 2,2'-azobis(2,4-dimethylvaleronitrile), and 2,2'-azobisisobutylate.

In particular, preferred are 2-methyl-1-[(4-methylthio) phenyl]-2-morpholinopropan-1-one, 2,2-dimethoxy-1,2-diphenylethan-1-one, 1-[4-(2-hydroxyethoxy)-phenyl]-2-hydroxy-2-methyl-1-propan-1-one, 1-hydroxycyclohexylphenyl ketone, 2-hydroxy-2-methyl-1-phenylpropan-1-one, iodonium (4-methylphenyl)[4-(2-methylpropyl)phenyl]-hexafluorophosphate, mixtures of 2-[2-oxo-2-phenylacetoxyethoxy]ethyl ester and 2-(2-hydroxyethoxyl)ethyl ester, phenyl glycosilate, and benzophenone.

The polymerization initiator may be a commercially available one, such as IRGACURE 907, IRGACURE 369, or IRGACURE 651 (manufactured by BASF). The polymerization initiator may be a single polymerization initiator or a combination of two or more initiators.

In the composition for optical imprint according to the present invention, the content of the polymerization initiator is preferably 0.01 to 20 parts by mass, more preferably 0.05 to 10 parts by mass, and even more preferably 0.08 to 5 parts by mass, based on 100 parts by mass of the polysiloxane. A content of the polymerization initiator within the above-mentioned range can readily provide satisfactory photocurability to the resulting composition for optical imprint.

[Organic Solvent]

The composition for optical imprint according to the present invention is preferably used as a solution prepared by dissolving all components, such as the polysiloxane and the polymerization initiator, in an appropriate organic solvent. The organic solvent may be a single solvent or a combination of two or more solvents. Examples of the organic solvent include alcohols, such as methanol, ethanol, propanol, and n-butanol; polyhydric alcohols, such as ethylene glycol, diethylene glycol, propylene glycol, and dipropylene glycol; ketones, such as acetone, methyl ethyl ketone, cyclohexanone, methyl n-amyl ketone, methyl isoamyl ketone, and 2-heptanon; derivatives of polyhydric alcohols such as compounds having ester bonds, e.g., ethylene glycol monoacetate, diethylene glycol monoacetate, propylene glycol monoacetate, and dipropylene glycol monoacetate, and compounds having ether bonds, e.g., monoalkyl ethers and monophenyl ethers of the polyhydric alcohols or the compounds having ester bonds mentioned above, such as monomethyl ethers, monoethyl ethers, monopropyl ethers, and monobutyl ethers; cyclic ethers such as dioxane; esters such as methyl lactate, ethyl lactate, methyl acetate, ethyl acetate, butyl acetate, methyl pyruvate, ethyl pyruvate, methyl methoxypropionate, and ethyl ethoxypropionate; and aromatic organic solvents such as anisole, ethylbenzyl ether, cresyl methyl ether, diphenyl ether, dibenzyl ether, phenetole, butylphenyl ether, ethylbenzene, diethylbenzene, amylbenzene, isopropylbenzene, toluene, xylene, cymene, and mesitylene. In particular, preferred are propylene glycol monomethyl ether acetate (PGMEA), propylene glycol monomethyl ether (PGME), and n-butanol.

The organic solvent may be used in any amount and is used such that the concentration of the polysiloxane is preferably 0.1% to 40% by mass, and more preferably 1% to 30% by mass.

[Other Components]

The composition for optical imprint according to the present invention may optionally contain other components, in addition to the polysiloxane, polymerization initiator, and organic solvent. An example of the additional component is a surfactant. The composition for optical imprint according to the present invention containing a surfactant readily exhibits further excellent transferability of a mold shape. The surfactant can be any known surfactant.

Method for Producing a Pattern

The method for producing a pattern according to the present invention comprises a step of forming a composition layer of the composition for optical imprint according to the present invention on a substrate; a step of deforming the composition layer by pressing a mold against the composition layer; a step of exposing the composition layer to light in a state of pressing the mold; a step of peeling the mold from the exposed composition layer; and a step of heating the composition layer after the step of peeling. The method for producing a pattern will now be described with reference to FIGS. 1A to 1D. FIGS. 1A to 1D show a process drawing illustrating a method for producing a pattern according to an embodiment of the present invention.

As shown in FIG. 1A, a composition 20 for optical imprint is applied onto a substrate 10 to form a composition layer of the composition 20 for optical imprint on the substrate 10. The substrate 10 is composed of a glass substrate, a Si wafer for semiconductor micromachining, copper wiring, an insulating layer, and other components.

The application of the composition 20 for optical imprint can be performed with a spin coater, a bar coater, a die coater, a roll coater, a reverse coater, or a slit coater or by spraying. The composition 20 for optical imprint applied onto the substrate 10 preferably has a uniform thickness for appropriately performing the substantial processing such as formation of a pattern. Accordingly, the application of the composition 20 for optical imprint onto the substrate 10 is preferably performed with a spin coater, a bar coater, or a die coater. The composition layer has a thickness of preferably 10 to 500 nm, and more preferably 30 to 150 nm.

Figure 1B:
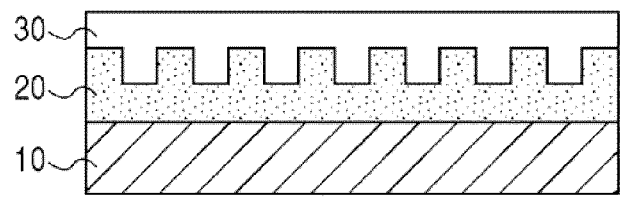

Subsequently, as shown in FIG. 1B, a mold 30 having a predetermined relief pattern structure is pressed against the composition 20 for optical imprint applied onto the substrate 10 to deform the composition 20 for optical imprint to fit the relief pattern structure of the mold 30.

Figure 1C:
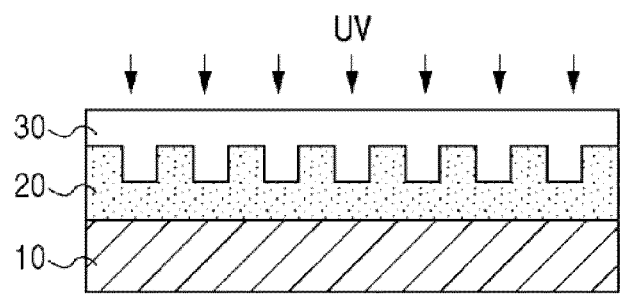

Subsequently, as shown in FIG. 1C, the composition 20 for optical imprint is exposed to light in a state of pressing the mold 30. Specifically, composition 20 for optical imprint is irradiated with electromagnetic waves such as ultraviolet (UV) rays. The composition 20 for optical imprint in the state of being pressed by the mold 30 is cured by light exposure and is formed into a cured film of a cured product of the composition 20 for optical imprint to which the relief structure of the mold 30 has been transferred. The mold 30 has transparency to the electromagnetic waves to be irradiated.

Figure 1D:
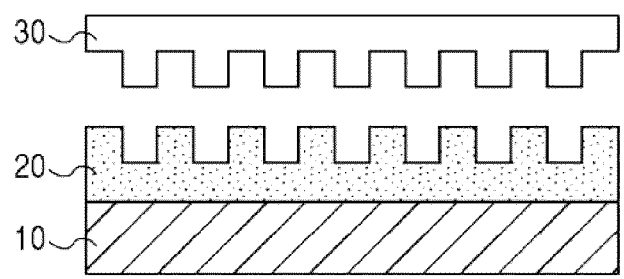

Subsequently, as shown in FIG. 1D, the mold 30 is peeled from the substrate 10. As a result, the cured composition 20 for optical imprint is patterned on the substrate 10. Thus, the peeling of the mold 30 from the substrate 10 after curing of the composition 20 for optical imprint can improve the conformance of the patterned shape to the relief structure of the mold 30 while reducing the pressing pressure of the mold 30.

Subsequently, the cured composition 20 for optical imprint is heated. As a result, the curing of the composition 20 for optical imprint is further promoted. The heating temperature is preferably 200° C. to 400° C., and more preferably 250° C. to 350° C. Thus, a pattern having excellent alkali resistance at high temperature can be provided.

Examples

The present invention will now be described in more detail, by way of examples, but is not limited to the following examples.

(Preparation of Composition for Imprint)

As shown in Table 1, a composition for imprint was prepared by mixing a polysiloxane, an organic solvent or alkoxysilane, and a polymerization initiator. The mass ratio of the polysiloxane and the organic solvent or alkoxysilane was 10:90. The content of the polymerization initiator was 0.1% by mass of the amount of the polysiloxane in each Example or Comparative Example excepting Comparative Example 1. In Comparative Example 1, the content of the polymerization initiator was 0.1% by mass of the total amount of the polysiloxane and the alkoxysilane.

The details of each component shown in Table 1 are as follows.

Polysiloxane (mass average molecular weight: 2500) in each Example or Comparative Example excepting Comparative Example 5:

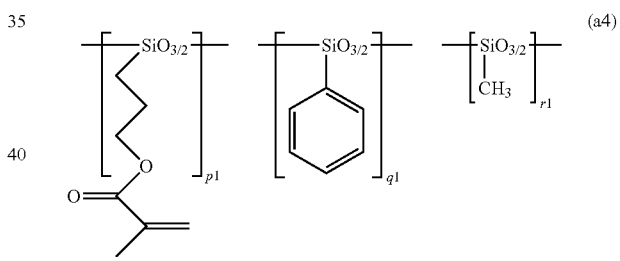

wherein, subscripts p1, q1, and r1 represent mole percentages of the structural units referred by the subscripts based on the total moles of structural units in the polysiloxane. The values of p1, q1, and r1 are shown in Table 1.

HSQ: hydrogen silsesquioxane (trade name: OCD T-12, manufactured by Tokyo Ohka Kogyo Co., Ltd., imprint material)

OKE: tetraethyl orthosilicate

PGMEA: propylene glycol monomethyl ether acetate

MMPOM: propylene glycol dimethyl ether (trade name: Hysorb MMPOM, manufactured by Toho Chemical Industry Co., Ltd.)

IR-907: IRGACURE 907 (trade name, manufactured by BASF)

IR-369: IRGACURE 369 (trade name, manufactured by BASF)

(Evaluation of Transferability)

The composition of each of Examples and Comparative Examples was applied onto a glass substrate with a spinner and was prebaked at 100° C. for 2 minutes to form a composition layer having a thickness of 100 nm. In Comparative Example 1, since no organic solvent was used, the prebake was omitted. Subsequently, a concave quartz mold was pressed against the composition layer at a press pressure of 0.5 MPa for 10 seconds at room temperature (25° C.) with nanoimprinter ST-200 (manufactured by Toshiba Machine Co., Ltd.). The composition layer was exposed to light for 30 seconds using i-Line LED attached to ST-200 (light intensity: 33 mW/cm$^2$) in the state of being pressed by the mold. The mold was then removed. The composition layer was ultimately heated at 300° C. for 10 minutes to give a structure of the cured product of the composition on the glass substrate.

The resulting structure was observed with a scanning electron microscope (SEM) and evaluated by the following evaluation criteria. The results are shown in Table 1.

A: It was confirmed that a line-and-space pattern structure having a width of 70 nm and a pitch of 250 nm was formed on the glass substrate.

B: A line-and-space pattern structure was formed on the glass substrate, but the width and pitch were not uniform.

C: Due to excessive hardness of the composition layer, no pattern was transferred even if the mold was pressed.
(Evaluation of Alkali Resistance)

The structures prepared in the evaluation of transferability were each immersed together with the glass substrate in an alkaline solution (aqueous 40 mass ppm sodium hydroxide solution, pH 10) at 50° C. After 30 minutes, the glass substrate was taken out, and the surface was visually observed to evaluate by the following evaluation criteria. The results are shown in Table 1.

A: The structure maintained the shape, and neither detachment of the structure from the glass substrate nor dissolution of the structure in the alkaline solution was observed.

B: The structure was dissolved in the alkaline solution.

TABLE 1

| | Polysiloxane | | | Organic solvent or alkoxysilane | Polymerization initiator | Transferability | Alkali resistance |
|---|---|---|---|---|---|---|---|
| | p1 | q1 | r1 | | | | |
| Comparative Example 1 | 90 | 0 | 10 | OKE | IR-907 | A | B |
| Comparative Example 2 | 90 | 0 | 10 | PGMEA | IR-369 | A | B |
| Comparative Example 3 | 19 | 80 | 1 | PGMEA | IR-369 | C | — |
| Example 1 | 39 | 60 | 1 | PGMEA | IR-369 | A | A |
| Example 2 | 59 | 40 | 1 | PGMEA | IR-369 | A | A |
| Example 3 | 69 | 30 | 1 | PGMEA | IR-369 | A | A |
| Example 4 | 79 | 20 | 1 | PGMEA | IR-369 | A | A |
| Example 5 | 84 | 15 | 1 | PGMEA | IR-369 | A | A |
| Comparative Example 4 | 89 | 10 | 1 | PGMEA | IR-369 | A | B |
| Example 6 | 50 | 40 | 10 | PGMEA | IR-369 | A | A |
| Example 7 | 60 | 30 | 10 | PGMEA | IR-369 | A | A |
| Comparative Example 5 | HSQ | | | MMPOM | — | B | B |

As shown in Table 1, both the transferability and the alkali resistance were excellent in the cases of using the compositions for optical imprint of Examples including polysiloxanes represented by Formula (a4) where the content of the structural unit referred by subscript p1 was 30% to 85% by mole and the content of the structural unit referred by subscript q1 was 15% to 70% by mole. In contrast, in the case of using the compositions for optical imprint of Comparative Examples 1, 2, and 4 including polysiloxanes represented by Formula (a4) where the content of the structural unit referred by subscript p1 was higher than 85% by mole and the content of the structural unit referred by subscript q1 was less than 15% by mole, although the transferability was excellent, the alkali resistance was poor. In the case of using the composition for optical imprint of Comparative Example 3 including a polysiloxane represented by Formula (a4) where the content of the structural unit referred by subscript p1 was less than 30% by mole and the content of the structural unit referred by subscript q1 was higher than 70% by mole, the transferability was poor. In the case of using the composition for imprint of Comparative Example 5 including a room temperature imprint material, the transferability was slightly poor, and the alkali resistance was poor.

What is claimed is:

1. A composition for optical imprint comprising:
   a polysiloxane;
   an organic solvent; and
   a polymerization initiator,
   wherein the polysiloxane consists of a polysiloxane represented by formula (a3) below:

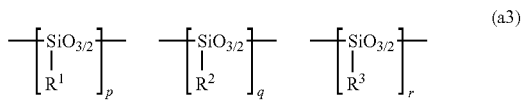

(a3)

wherein R$^1$ represents a group containing an ethylenic double bond; R$^2$ represents an aryl group having 6 to 15 carbon atoms which may have a substituent; R$^3$ represents an alkyl group having 1 to 6 carbon atoms; subscripts p, q, and r represent mole percentages of the structural units referred to by the subscripts based on the total moles of structural units in the polysiloxane; the percentage p is 30% to 85% by mole; the percentage q is 15% to 70% by mole; and the percentage r is 0% to 40% by mole; provided that the sum of the percentages p, q, and r is 100% by mole, and the percentage r is not higher than the percentage p,
   and wherein the composition for optical imprint does not comprise an alkoxysilane.

2. The composition for optical imprint according to claim 1, wherein the structural unit 2 content is 20% to 60% by mole based on the entire structural units in the polysiloxane.

3. The composition for optical imprint according to claim 1, wherein R$^1$ represents a group containing an ethylenic double bond at a terminal thereof.

4. The composition for optical imprint according to claim 1, wherein R$^1$ represents an acryloyloxyalkyl or methacryloyloxyalkyl group.

5. The composition for optical imprint according to claim 1, wherein R$^2$ represents an aryl group having 6 to 10 carbon atoms which may have a substituent.

6. The composition for optical imprint according to claim 1, wherein the structural unit 1 content is 40% to 80% by mole based on the entire structural units in the polysiloxane.

7. The composition for optical imprint according to claim 1, wherein a mass average molecular weight of the polysiloxane is 500 to 10000.

8. The composition for optical imprint according to claim 1, wherein R$^3$ represents an alkyl group having 1 to 4 carbon atoms.

9. The composition for optical imprint according to claim 1, wherein the percentage p is 40% to 80% by mole.

10. The composition for optical imprint according to claim 1, wherein the percentage q is 20% to 60% by mole.

11. The composition for optical imprint according to claim 1, wherein the percentage r is 1% to 30% by mole.

12. The composition for optical imprint according to claim 1, wherein a content of the polymerization initiator is 0.01 to 20 parts by mass based on 100 parts by mass of the polysiloxane.

13. The composition for optical imprint according to claim 1, wherein the organic solvent is at least one selected from the group consisting of an alcohol, ketone, ester, ether, and aromatic organic solvent.

14. The composition for optical imprint according to claim 1, wherein an amount of the organic solvent is such that a concentration of the polysiloxane in the composition is 0.1% to 40% by mass.

15. A method for producing a pattern comprising:
   forming a composition layer of the composition for optical imprint according to claim 1 on a substrate;
   deforming the composition layer by pressing a mold against the composition layer;
   exposing the composition layer to light in a state of pressing the mold;
   peeling the mold from the exposed composition layer; and
   heating the composition layer after the peeling.

* * * * *